United States Patent
Mochizuki

(10) Patent No.: US 9,224,925 B2
(45) Date of Patent: Dec. 29, 2015

(54) SEMICONDUCTOR LIGHT-EMITTING DEVICE AND MANUFACTURING METHOD

(71) Applicant: Stanley Electric Co., Ltd., Tokyo (JP)

(72) Inventor: Mika Mochizuki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/748,099

(22) Filed: Jan. 23, 2013

(65) Prior Publication Data

US 2013/0193458 A1    Aug. 1, 2013

(30) Foreign Application Priority Data

Jan. 26, 2012 (JP) ................................ 2012-013760

(51) Int. Cl.
*H01L 33/50* (2010.01)
*H01L 33/52* (2010.01)
*H01L 27/15* (2006.01)
*H01L 33/54* (2010.01)
*H01L 33/58* (2010.01)
*H01L 33/60* (2010.01)

(52) U.S. Cl.
CPC ............. *H01L 33/50* (2013.01); *H01L 27/15* (2013.01); *H01L 33/505* (2013.01); *H01L 33/54* (2013.01); *H01L 33/58* (2013.01); *H01L 33/60* (2013.01); *H01L 2224/13* (2013.01); *H01L 2933/005* (2013.01); *H01L 2933/0041* (2013.01)

(58) Field of Classification Search
None
See application file for complete search history.

(56) References Cited

U.S. PATENT DOCUMENTS

| | | | |
|---|---|---|---|
| 4,733,335 A | 3/1988 | Serizawa et al. | |
| 5,101,326 A | 3/1992 | Roney | |
| 6,273,596 B1 | 8/2001 | Parkyn, Jr. | |
| 6,850,001 B2 | 2/2005 | Takekuma | |
| 7,128,454 B2 | 10/2006 | Kim et al. | |
| 2004/0239243 A1* | 12/2004 | Roberts et al. | ................ 313/512 |

(Continued)

FOREIGN PATENT DOCUMENTS

| | | |
|---|---|---|
| EP | 2 555 262 A2 | 2/2013 |
| JP | 2001-77430 A | 3/2001 |

(Continued)

OTHER PUBLICATIONS

List of Potentially Related Pending U.S. Appl. No. 13/791,888 to Hirokazu Seki filed Mar. 8, 2013 and U.S. Appl. No. 14/154,821 to Takao Saito filed Jan. 14, 2014.

*Primary Examiner* — Johannes P Mondt
(74) *Attorney, Agent, or Firm* — Kenealy Vaidya LLP

(57) ABSTRACT

A semiconductor light-emitting device and a method for manufacturing the same can include a wavelength converting layer located on at least one semiconductor light-emitting chip in order to emit various colored lights including white light. The semiconductor light-emitting device can include a casing having a cavity and a mounting surface, the chip mounted on the mounting surface, a transparent plate mounted on the wavelength converting layer within a top surface of the chip and a reflective layer located in the cavity so as to surround the transparent plate, the wavelength converting layer and the chip. The semiconductor light-emitting device can be configured to improve light-colored variability and light-emitting efficiency of the chip by using the reflective layer as a reflector, and therefore can emit a wavelength-converted light having a substantially uniform color tone and a high light-emitting efficiency from a smaller light-emitting surface than the top surface of the chip.

20 Claims, 6 Drawing Sheets

(56) References Cited

U.S. PATENT DOCUMENTS

| | | |
|---|---|---|
| 2005/0068786 A1 | 3/2005 | Ishida |
| 2005/0094413 A1 | 5/2005 | Sazuka et al. |
| 2005/0219856 A1 | 10/2005 | Tatsukawa |
| 2008/0007961 A1 | 1/2008 | Mochizuki et al. |
| 2010/0163892 A1* | 7/2010 | Liu ................................. 257/89 |
| 2010/0232173 A1 | 9/2010 | Ohno |
| 2011/0235355 A1 | 9/2011 | Seko |
| 2011/0249222 A1 | 10/2011 | Nakagawa et al. |
| 2011/0249460 A1 | 10/2011 | Kushimoto |
| 2011/0309388 A1* | 12/2011 | Ito et al. .......................... 257/89 |
| 2012/0007130 A1* | 1/2012 | Hoelen et al. .................... 257/98 |
| 2012/0025218 A1 | 2/2012 | Ito |
| 2012/0235169 A1 | 9/2012 | Seko |

FOREIGN PATENT DOCUMENTS

| | | |
|---|---|---|
| JP | 2005-141919 A | 6/2005 |
| JP | 2005-294176 A | 10/2005 |
| JP | 2006-172829 A | 6/2006 |
| JP | 2007-5182 A | 1/2007 |
| JP | 2008-13014 A | 1/2008 |
| JP | 2010-219324 A | 9/2010 |
| JP | 2011-31807 A | 2/2011 |
| JP | 2011-31808 A | 2/2011 |
| JP | 2011-100785 A | 5/2011 |
| JP | 2011-221371 A | 11/2011 |
| JP | 2012-9760 A | 1/2012 |

* cited by examiner

FIG. 1
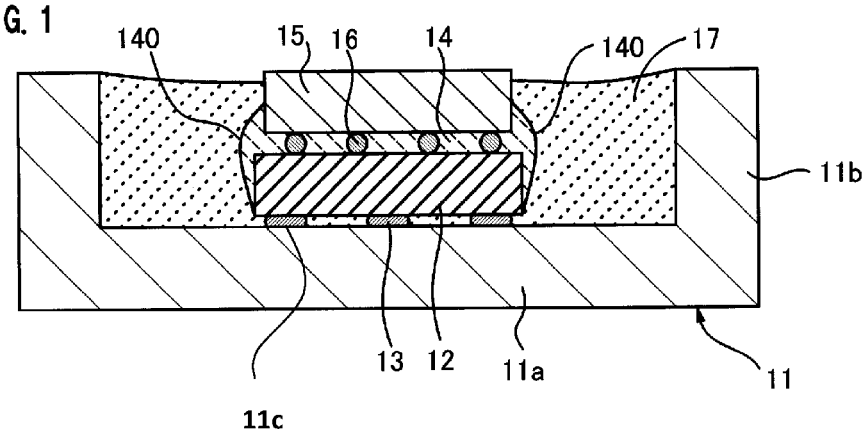
FIG. 2 Comparative Embodiment
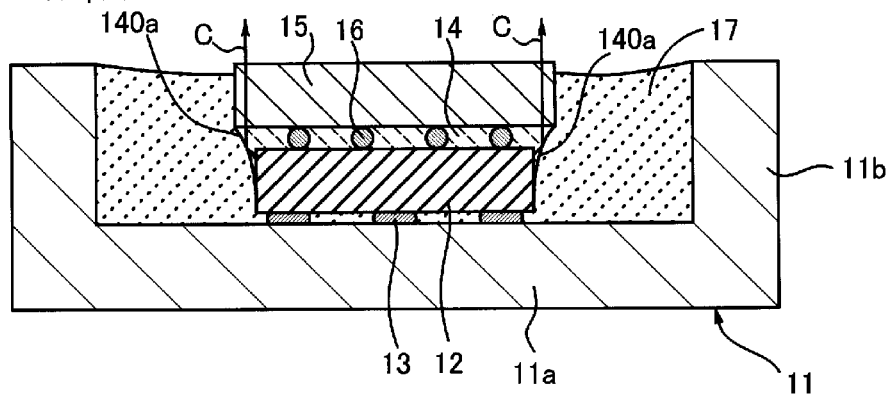

FIG. 3
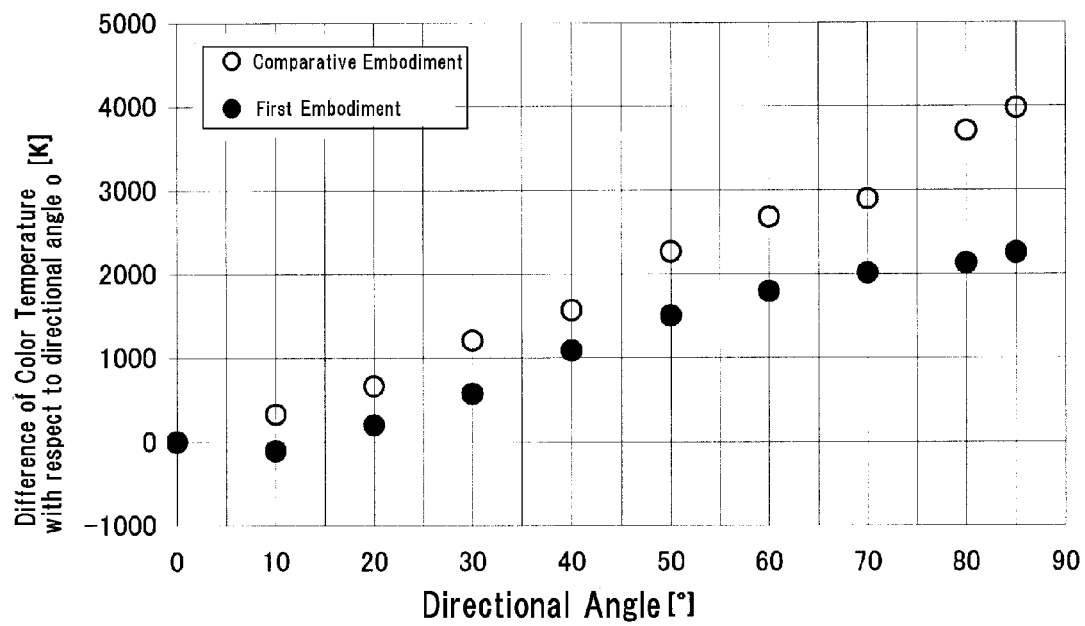
FIG. 4a
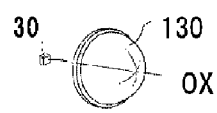
FIG. 4b Comparative Embodiment
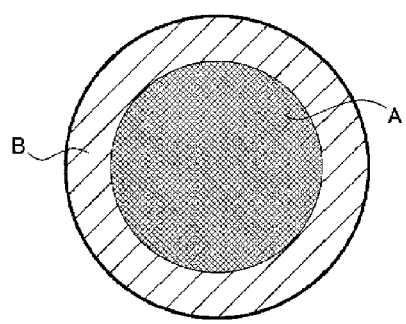

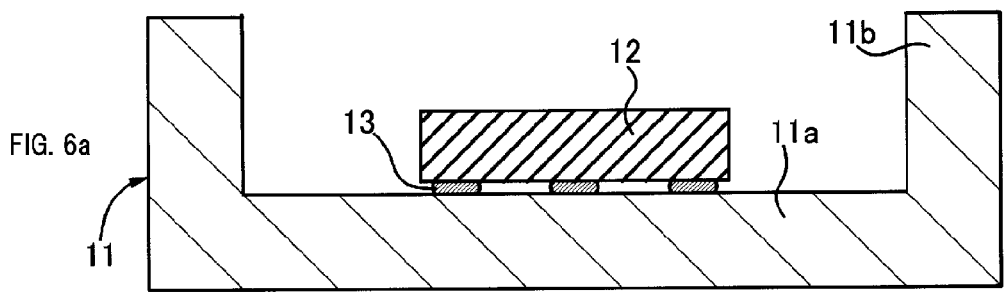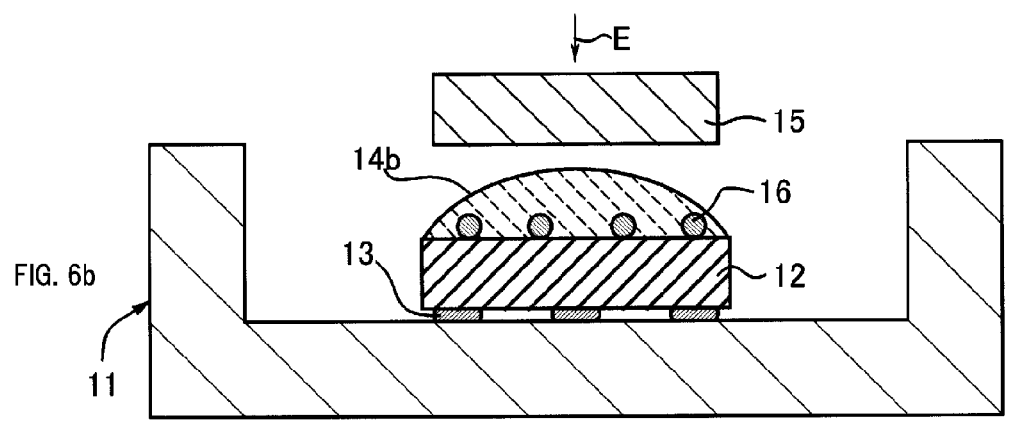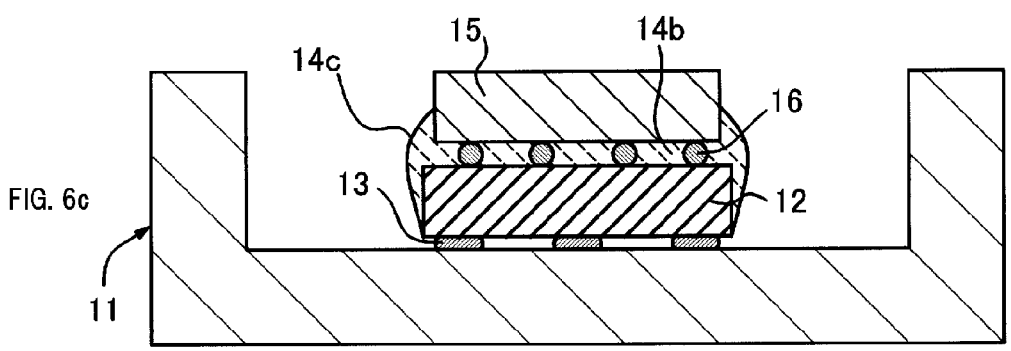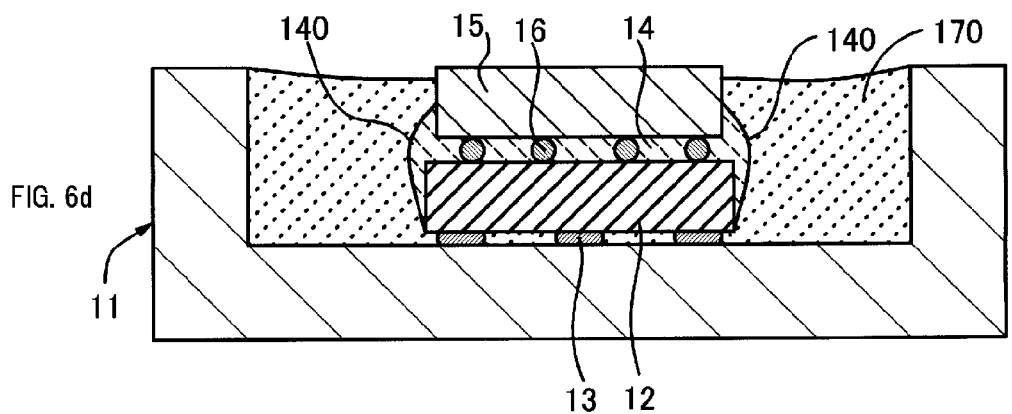

SEMICONDUCTOR LIGHT-EMITTING DEVICE AND MANUFACTURING METHOD

This application claims the priority benefit under 35 U.S.C. §119 of Japanese Patent Application No. 2012-013760 filed on Jan. 26, 2012, which is hereby incorporated in its entirety by reference.

BACKGROUND

1. Field

The presently disclosed subject matter relates to semiconductor light-emitting devices in which light emitted from a semiconductor light-emitting chip is wavelength-converted by a wavelength converting layer, and to manufacturing methods for the same. More particularly, the disclosed subject matter relates to semiconductor light-emitting devices for a vehicle light and the like, which can emit various color lights having a substantially uniform color tone and a high light-emitting efficiency from a small light-emitting surface, and to methods of manufacturing such devices.

2. Description of the Related Art

Semiconductor light-emitting devices, in which a part of the light emitted from a semiconductor light-emitting chip is converted into light having a different wavelength by a phosphor and in which a mixture light including the light having the different wavelength mixed with the light emitted directly from the semiconductor light-emitting chip is emitted, have been known as semiconductor light source(s) for various lighting units. In this case, the semiconductor light-emitting devices are usually provided with a wavelength converting layer including a phosphor particle on or over the semiconductor light-emitting chip such as an LED chip, etc.

A conventional semiconductor light-emitting device including such a wavelength converting layer, for example, is disclosed in Patent Document No. 1 (Japanese Patent Application Laid Open JP2010-219324). FIGS. 9a and 9b are respectively a top view and a side cross-sectional view taken along line A-A in FIG. 9a showing the conventional semiconductor light-emitting device, which may be used as a light source for general lighting and the like and which is disclosed in Patent Document No. 1.

The conventional semiconductor light-emitting device 300 includes: a mounting board 50; a conductor pattern 51 formed on the mounting board 50; a frame 55 formed in a tubular shape and being located on the mounting board 50; a semiconductor light-emitting chip 60 mounted on the conductor pattern 51: an optical transparent material 70 including a wavelength converting layer and being located on the semiconductor light-emitting chip 60 via a light-transmitting material 80; a sealing material 40 including a light-reflecting material 45 and being disposed between the frame 55 and at least the optical transparent material 70; and a light-emitting surface 90 exposed from a top surface of the optical transparent material 70 as a light-emitting surface of the device 300 so as to be able to emit a wavelength converted light.

In this case, when the semiconductor light-emitting chip 60 is a blue LED chip emitting blue light and the optical transparent material 70 is composed of the wavelength converting layer including a yellow phosphor, which can emit a yellow light upon being excited by the blue light emitted from the blue LED chip, the semiconductor light-emitting device 300 can emit substantially white light from the light-emitting surface 90, by an additive color mixture of the excited yellow light emitted from the yellow phosphor and a part of the blue light emitted from the blue LED chip.

In the conventional semiconductor light-emitting device having such a structure, the sealing material 40 including the light-reflecting material 45 is frequently disposed between the frame 55 and the optical transparent material 70 including the wavelength converting layer, the semiconductor light-emitting chip 60, etc. to improve a light-emitting efficiency of the device. However, in the conventional light-emitting device, such structure may be subject to color variability in the wavelength converted light.

For example, when the semiconductor light-emitting device 300 is configured to emit substantially white light, in which an additive color mixture of the excited yellow light emitted from the yellow phosphor and the part of the blue light emitted from the blue LED chip is employed, bluish white light may be emitted from a central portion of the light-emitting surface 90 and yellowish white light may be emitted from an outer portion of the light-emitting surface 90.

Meanwhile, it has been understood that a color temperature of the wavelength converted light varies according to a density of the phosphor contained in the wavelength converting layer. That is because the amount of the excited light varies in accordance with the amount of phosphor contained in the wavelength converting layer. Accordingly, it is understood that the density of the phosphor can be higher to increase the original light except the excited light in light emitted from the semiconductor light-emitting chip and also a thickness of the wavelength converting layer becomes thicker.

However, when the density of the phosphor becomes higher and/or the thickness of the wavelength converting layer becomes thicker, a light-emitting loss may be large, and therefore a light-emitting efficiency of the semiconductor light-emitting device may increase. Additionally, when the semiconductor light-emitting devices are used as a light source for a lighting unit such as a vehicle headlight, which controls light emitted from the light-emitting devices using a reflector and/or a projector lens, a light-emitting device having a small light-emitting surface may be desired to efficiently control light emitted from the light-emitting device with a small optical structure.

Hence, another conventional semiconductor light-emitting device having a small light-emitting surface can be used as a light source for a vehicle headlight using a projector lens and is disclosed in Patent Document No. 2 (U.S. patent application Ser. No. 13/162,151, U.S. Patent Publication No. US 2011/0309388 A1). Patent Document No. 2 discloses a small light-emitting surface, which is slightly larger than a top surface of a semiconductor light-emitting chip.

The above-referenced Patent Documents are listed below, and are hereby incorporated with their English abstracts in their entireties.

1. Patent Document No. 1: Japanese Patent Application Laid Open JP2010-219324.
2. Patent Document No. 2: U.S. patent application Ser. No. 13/162,151, U.S. Patent Publication No. 2011-0309388 A1.
3. Patent Document No. 3: U.S. Patent Publication No. 2012-0025218-A1.
4. Patent Document No. 4: U.S. Divisional patent application (Parent U.S. patent application Ser. No. 12/720,819, U.S. Pat. No. 8,251,560.
5. Patent Document No. 5: U.S. Patent Application No. 2012-0320617 A1

The disclosed subject matter has been devised to consider the above and other problems, features, and characteristics. Thus, embodiments of the disclosed subject matter can include semiconductor light-emitting devices that can emit a wavelength converted light having a substantially uniform color tone and a high light-emitting efficiency from a small light-emitting surface, which is smaller than a top surface of a semiconductor light-emitting chip, and associated manufacturing methods that do not cause and/or are designed to prevent some of the above-described problems, concerns, and characteristics related to a wavelength converting layer and/or lighting device. The disclosed subject matter can also include a semiconductor light-emitting device using a plurality of semiconductor light-emitting chips that can be used for wavelength-converting light having a substantially uniform color tone and a high light-emitting efficiency.

SUMMARY

The presently disclosed subject matter has been devised in view of the above and other problems, features, and characteristics. An aspect of the disclosed subject matter includes methods of manufacture that provide semiconductor light-emitting devices having a small light-emitting surface and a high light-emitting efficiency in addition to light having a substantially uniform color tone such that can be used to illuminate goods laid out in a show window, and which can provide a similar lead time while using a similar manufacture machine in comparison with conventional semiconductor light-emitting devices and processes.

According to an aspect of the disclosed subject matter, a semiconductor light-emitting device can include: a base board having a conductor pattern formed on a mounting surface having an outer circumference; a frame formed in a tubular shape and located on the outer circumference of the base board; at least one semiconductor light-emitting chip including chip electrodes adjacent a bottom surface thereof, each of the chip electrodes electrically connected to a respective portion of the conductor pattern of the base board via solder bumps; a transparent plate located over a top surface of the semiconductor light-emitting chip so that the top surface of the chip covers a bottom surface thereof; and a wavelength converting layer including at least one phosphor, and disposed between side surfaces of the transparent plate and the semiconductor light-emitting chip so that a side surface thereof includes a convex surface.

In addition, the semiconductor light-emitting device can include a reflective layer having a side surface including a concave surface formed by a contact with the convex surface of the wavelength converting layer, the reflective layer disposed at least between the frame and the side surfaces of the wavelength converting layer and the transparent plate and between a bottom surface of the semiconductor light-emitting chip and the mounting surface of the base board while surrounding the solder bumps, wherein the side surface thereof contacts with at least the side surface of the wavelength converting layer and a part of the side surface of the transparent plate, and thereby the reflective layer seals the wavelength converting layer along with the transparent plate and the semiconductor light-emitting chip, and wherein an optical axis of the semiconductor light-emitting device extends substantially normal to the top surface of the semiconductor light-emitting chip from a substantially center of the top surface thereof.

In the above-described exemplary semiconductor light-emitting device, the transparent plate can be located over the top surface of the semiconductor light-emitting chip so that the bottom surface thereof covers the top surface of the chip, and also the frame can be integrated into the base board as one casing. The wavelength converting layer can include a spacer to maintain a substantially uniform thickness of the wavelength converting layer disposed between the transparent plate and the semiconductor light-emitting chip. The semiconductor light-emitting chip can be an ultraviolet light-emitting chip and the phosphor can include at least one of a red phosphor, a green phosphor, and a blue phosphor, and also the chip can include a blue light-emitting chip and the phosphor can be selected from the group consisting of a yellow phosphor, and two phosphors including a red phosphor layer and a green phosphor layer. Additionally, the semiconductor device can further include a projector lens located in a light-emitting direction thereof so that an optical axis of the projector lens corresponds to the substantially optical axis thereof and a focus of the projector lens is located close to the semiconductor device.

According to the above-described exemplary semiconductor light-emitting device, the device can emit a wavelength converted light from the top surface of the transparent plate that is smaller than the top surface of the semiconductor light-emitting chip while the reflective layer can be used as a reflector that extends from the side surface of the semiconductor light-emitting chip toward the side surface of the transparent plate and contacts with the bottom surface of the light-emitting chip. In this case, light excited by light emitted in a crosswise direction of the semiconductor light-emitting chip can be reflected on the side concave surface of the reflective layer, and can be directed toward a central region of the top surface of the transparent plate. The exited light directed toward the central region can be mixed with light having an original wavelength emitted along the optical axis of the device in light emitted from the chip, and therefore a color temperature on the central region of the light-emitting surface can increase and a color temperature on an outer region can reduce as compared with conventional devices. Thus, the disclosed subject matter can provide semiconductor light-emitting devices that can emit a wavelength converted light having a substantially uniform color tone and a high light-emitting efficiency from a very small light-emitting surface.

Another aspect of the disclosed subject matter includes methods for manufacturing the above-described semiconductor light-emitting devices. An exemplary method can include: providing the casing; connecting each of the chip electrodes of the semiconductor light-emitting chip to a respective portion of the conductor pattern of the base board of the casing via the solder bumps; disposing an uncured wavelength converting material between the bottom surface of the transparent plate and the top surface of the semiconductor light-emitting chips so as to be spilled between the transparent plate and the semiconductor light-emitting chip, and therefore the uncured wavelength converting material forming the side convex surface between the side surfaces of the transparent plate and the semiconductor chip; and disposing an uncured reflective material between the frame and the side surfaces of the wavelength converting layer and the transparent plate and between the bottom surface of the semiconductor light-emitting chip and the mounting surface of the base board.

In the above-described exemplary method for manufacturing semiconductor light-emitting devices, the same or similar variations of the device can also be employed as set forth in preceding paragraphs.

According to the exemplary manufacturing method described above for the semiconductor light-emitting devices, the reflective layer used as the reflector can be formed by disposing an uncured reflective material between the frame and the both side surfaces of the wavelength converting layer and the transparent plate and between the bottom surface of the semiconductor light-emitting chip and the mounting surface of the base board. The wavelength converting material and the reflective material can be solidified by a similar method as compared to conventional processes. Thus, the method can provide semiconductor light-emitting devices having a substantially uniform color tone, a high light-emitting efficiency and a small light-emitting surface using manufacturing machines that are similar to those used to manufacture conventional semiconductor light-emitting devices.

BRIEF DESCRIPTION OF THE DRAWINGS

These and other characteristics and features of the disclosed subject matter will become clear from the following description with reference to the accompanying drawings, wherein:

FIG. 1 is a side cross-sectional view showing a first exemplary embodiment of a semiconductor light-emitting device made in accordance with principles of the disclosed subject matter;

FIG. 2 is a side cross-sectional view showing a comparative embodiment made to compare optical characteristics of the first embodiment of FIG. 1;

FIG. 3 is a graph showing a relation between a directional angle and a difference of color temperature with respect to directional angle zero in each of the first embodiment shown in FIG. 1 and the comparative embodiment of FIG. 2, wherein zero degree is each of the optical axes, which extend normal to light-emitting surfaces of devices from a center of a top surface of a semiconductor light-emitting chip;

FIG. 4a is a perspective structural view showing a second exemplary embodiment, which combines the semiconductor light-emitting device of FIG. 1 with a projector lens, and FIG. 4b is an explanatory drawing depicting a light distribution pattern when replacing the semiconductor light-emitting device of FIG. 4a with the comparative embodiment of FIG. 2;

FIGS. 6a to 6d are cross-sectional views showing an exemplary manufacturing process for a semiconductor light-emitting device made in accordance with principles of the disclosed subject matter;

DETAILED DESCRIPTION OF EXEMPLARY EMBODIMENTS

Figure 5:
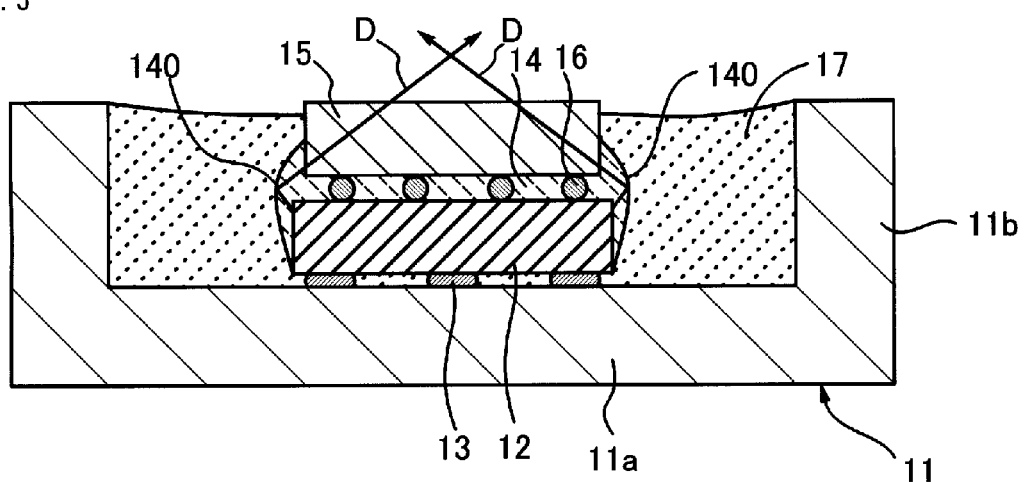
FIG. 5 is a cross-sectional view showing path directions of light components in a crosswise direction of the semiconductor light-emitting chip emitted from the chip in the semiconductor light-emitting device of FIG. 1.

Exemplary embodiments and manufacturing methods of the disclosed subject matter will now be described in detail with reference to FIGS. 1 to 8. FIG. 1 is a side cross-sectional view showing a first exemplary embodiment of a semiconductor light-emitting device made in accordance with principles of the disclosed subject matter.

The semiconductor light-emitting device can include: a casing 11 having a cavity, an opening, a mounting surface and conductor patterns 11c formed on the mounting surface, and formed in cup shape; at least one semiconductor light-emitting chip 12 having a top surface, a bottom surface, a side surface and chip electrodes adjacent the bottom surface mounted on the mounting surface of the casing 11 via solder bumps 13, and each of the chip electrodes electrically connected to respective conductor patterns 11c of the casing 11 via the solder bumps 13; a transparent plate 15 having a top surface, a bottom surface and a side surface located over the top surface of the semiconductor light-emitting chip 12 so as to be located within a range of the top surface of the semiconductor light-emitting chip 12, and the top surface and bottom surface thereof being slightly smaller than the top surface of the semiconductor light-emitting chip 11.

In addition, the semiconductor light-emitting device can include; a wavelength converting layer 14 having a side convex surface 140 disposed between the side surface of the semiconductor light-emitting chip 12 and the side surface of the transparent plate 15 so as to extend in an outer direction of the semiconductor light-emitting chip 12 between the side surface of the semiconductor light-emitting chip 12 and the side surface of the transparent plate 15; and a reflective layer 17 having a top surface and a side surface made of a material having a high reflectivity, disposed between the cavity of the casing 11 so as to fill a space between the solder bumps 13, the side surface thereof including a concave surface and contacting with the side surface of the transparent plate 15 and the side convex surface 140 of the wavelength converting layer 14, and the concave surface of the side surface thereof formed by contacting with the side convex surface 140 of the wavelength converting layer 14.

By disposing the reflective layer 17 between the bottom surface of the semiconductor light-emitting chip 12 and the mounting surface of the casing 11 so as to fill the space between the solder bumps 13, light emitted in a downward direction of the semiconductor light-emitting chip 12 from the semiconductor light-emitting chip 12 can be reflected on the reflective layer 17 and can be emitted from the top surface of the semiconductor light-emitting chip 12. Accordingly, a light-emitting efficiency of the semiconductor light-emitting device can improve.

The bottom surface of the transparent plate 15 can be slightly smaller than the top surface of the semiconductor light-emitting chip 12, and the transparent plate 15 can be located over the semiconductor light-emitting chip 12 so that the top surface of the semiconductor light-emitting chip 12 can cover the bottom surface of the transparent plate 15. In other words, an outermost periphery of the semiconductor light-emitting chip 12 will be completely blocked from view by the transparent plate 15 when the device is viewed from a position on the main optical axis which extends normal to the top center surface of the semiconductor light-emitting chip 12.

Therefore, the side surface of the reflective layer 17 including the concave surface, which is formed on a boundary between the reflective layer 17 and both the transparent plate 15 and the wavelength material layer 14, can become a reflective surface along with a boundary between the reflective layer and the bottom surface of the semiconductor light-emitting chip 12. The side surface of the reflective layer 17 can reflect light emitted in a crosswise direction from the wavelength converting layer 14 toward the bottom surface of the transparent plate 15, and also can return light in a crosswise direction from the semiconductor light-emitting chip 12 toward the semiconductor light-emitting chip 12 and finally can direct the light toward the bottom surface of the transparent plate 15.

Accordingly, the reflective layer 17 can perform as a reflector for the semiconductor light-emitting chip 12 by using the side surface thereof and the boundary between the bottom surface of the semiconductor light-emitting chip 12 and reflective layer 17. The above reflector can be configured as a reflective structure that slightly narrows from the semiconductor light-emitting chip 12 toward the transparent plate 15 and that expands between the top end and a bottom end of the side surface of the wavelength converting layer 14. In addition, because the reflective layer 17 contacts with the side surface of the transparent plate 15, the top surface of the transparent plate 15 can perform as a light-emitting surface of the semiconductor light-emitting device and can be formed in a smaller shape than the top surface of the semiconductor light-emitting chip 12.

Thus, the disclosed subject matter can provide semiconductor light-emitting devices having a high light-emitting efficiency while realizing a very small light-emitting surface, which is smaller than the top surface of the semiconductor light-emitting chip 12 by using the top surface of the transparent plate 15, and can provide semiconductor light-emitting devices that can emit a wavelength converted light having a substantially uniform color tone from the small light-emitting surface, as described in detail later.

The top surface of the transparent plate 15, which can become the light-emitting surface of the semiconductor light-emitting device, can be formed in various shapes so as to be able to emit light having a desired light distribution pattern in accordance with a variety of usages, specifications and the like for the light-emitting device. A top end of the side surface of the wavelength converting layer 14 can also be formed in various shapes so as to be matched with the top surface of the transparent plate 15.

In addition, the wavelength converting layer 14 can be made by mixing a phosphor with a transparent resin, an inorganic binder and the like in order to be able to emit light having a desired color tone while collaborating with the semiconductor light-emitting chip 12 as described in more detail later. The reflective layer 17 can be formed in the above-described structural shape by filling an uncured reflective material in the cavity of the casing 11 and by solidifying the uncured reflective material. The top surface of the reflective layer 17 can be formed in a substantially planar shape in the cavity of the casing 11, and also can seal the opening of the casing 11 along with the transparent plate 15, as shown in FIG. 1.

The side surface of the reflective layer 17 toward the semiconductor light-emitting chip 12 does not always need be contacted only with the wavelength converting layer 14, but may also be contacted with the side surface of the semiconductor light-emitting chip 12, for example, a part of the side surface of the semiconductor light-emitting chip 12, which is located under the bottom end of the side surface of the wavelength converting layer 14.

When a part of the side surface of the reflective layer 17 is located on the side surface of the semiconductor light-emitting chip 12, the side surface can become the reflex surface, which can return light emitted in the crosswise direction of the semiconductor light-emitting chip 12 toward the semiconductor light-emitting chip 12. When the semiconductor light-emitting chip 12 is a flip-chip type chip, because a light-emitting layer of the semiconductor light-emitting chip 12 may be located close to the bottom surface of the semiconductor light-emitting chip 12, a reflex feature of the side surface can be performed with high efficiency Next, each of the above-described elements will now be described. The casing 11 can include an Aluminum nitride substrate having a high thermal conductivity, a ceramic substrate, a resin and the like, and can be composed of a base board 11a and a frame 11b integrally as one body as shown in FIG. 1. The conductor patterns can be made from Au (gold) and the like and formed on the mounting surface, which is located on a bottom portion in the cavity of the casing 11. The casing 11 can also be made separately of the base board 11a, which is formed in a plate shape, and the frame 11b, which is formed in a tubular shape.

In this case, the casing 11 can be made by mounting the frame 11b on an outer circumference of the base board 11a via an adhesive material, etc. The conductor patterns can be made from Au (gold) and the like and formed on the mounting surface in the cavity of the casing 11 to mount the semiconductor light-emitting chip 12 via the solder bumps 13 and to receive a power supply for the semiconductor light-emitting chip 12. The solder bumps 13 can be made of gold (Au), other metals, etc. The conductor patterns formed on the mounting surface of the casing 11 can extend toward an outer surface of the casing 11 via through holes so that it is easy to provide power supply to the semiconductor light-emitting chip 12.

Figure 8:
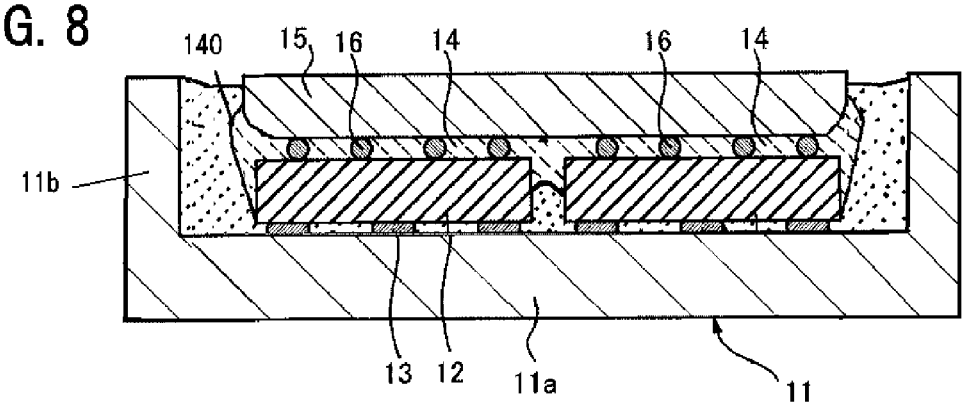
FIG. 8 is a side cross-sectional view showing a third exemplary embodiment of a semiconductor light-emitting device made in accordance with principles of the disclosed subject matter.
Figure 9A:
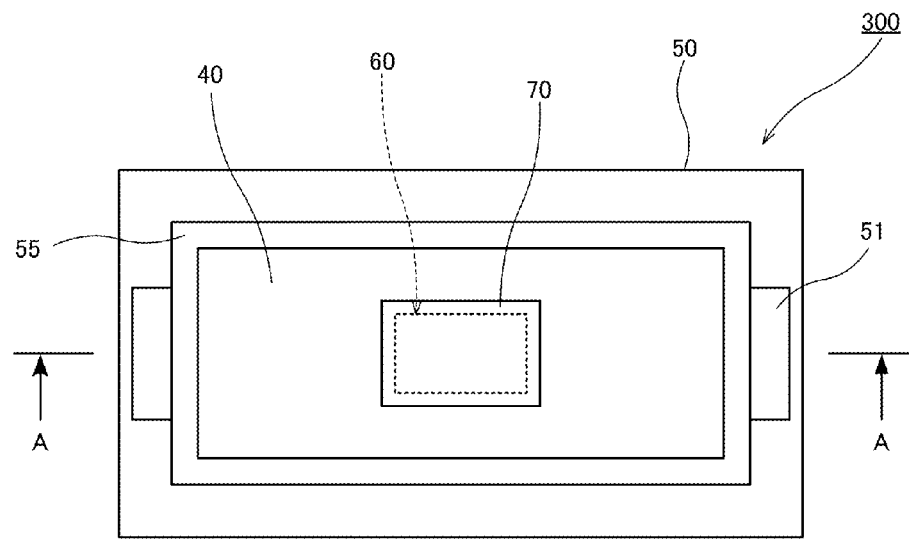
FIGS. 9a and 9b are a schematic top view and a schematic front cross-sectional view showing a conventional semiconductor light-emitting device, respectively.
Figure 9B:
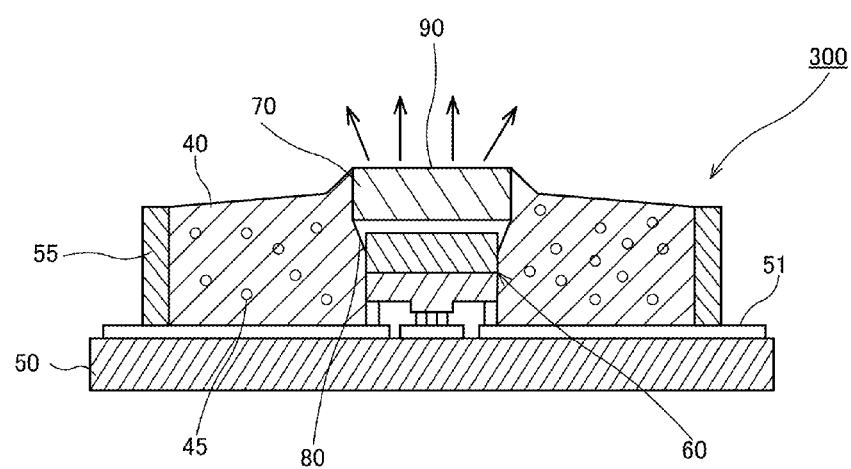

The semiconductor light-emitting chip 12 can be a blue LED chip having a peak wavelength of 460 nanometers. The wavelength converting layer 14 can include a phosphor to convert light emitted from the semiconductor light-emitting chip 12 into a particular wavelength or range of wavelengths of light. Thus, the phosphor can be excited by the light emitted from the semiconductor light-emitting chip 12, and can emit a wavelength-converted light. Accordingly, the semiconductor light-emitting device can emit a different wavelength from that of the semiconductor light-emitting chip 12 by an additive color mixture of a part of the light emitted from the semiconductor light-emitting chip 12 and the wavelength converted light excited by another part of the light. In addition, a plurality of various chips can also be used as the semiconductor light-emitting chip 12, as shown in FIG. 8 later.

The wavelength converting layer 14 can include a resin layer that is made by mixing a yellow phosphor such as YAG with a transparent resin such as a silicone resin and the like. In this case, the semiconductor light-emitting chip 12 can be a blue LED chip having a peak wavelength of 460 nanometers. The yellow phosphor can emit a yellow light upon being excited by blue light emitted from the blue LED chip. The semiconductor light-emitting device can emit substantially white light that can be used as a light source for a headlight, an illumination for a show window and the like, by an additive color mixture of the excited yellow light emitted from the yellow phosphor and a part of the blue light emitted from the blue LED chip.

The yellow phosphor can include, $Y_3Al_5O_{12}$: $Ce^{3+}$ (YAG), $(Sr, Ba)_2SiO_4$: $Eu^{2+}$, $Ca_x(Si, Al)_{12}(O, N)_{16}$: $Eu^{2+}$ and the like. In place of the yellow phosphor, a red phosphor wavelength-converting the blue light emitted from the blue LED chip into red-purple light, and a green phosphor wavelength-converting the blue light into blue-green light can also be used. In this case, the semiconductor light-emitting device can emit light having substantially white light by an additive color mixture of the red-purple light emitted from the red phosphor that is excited by the blue light, the blue-green light emitted from the green phosphor that is excited by the blue light and a part of the blue light.

The red phosphor can include $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like. $Y_3(Ga, Al)_5O_{12}$: $Ce^{3+}$, $Ca_3Sc_2Si_3O_{12}$: $Ce^{3+}$, $CaSc_2O_4$: $Eu^{2+}$, $(Ba, Sr)_2SiO_4$: $Eu^{2+}$, $Ba_3Si_6O_{12}N_2$: $Eu^{2+}$, $(Si, Al)_6(O, N)$: $Eu^{2+}$ and the like can be used as the green phosphor. The semiconductor light-emitting chip 13 can include an LED of InGaN series that emits near-ultraviolet light having a wavelength of approximately 380 nanometers, a laser diode that emits ultraviolet light at a high power, and the like.

In this case, in order to emit substantially white light such that can be used as a light source for a headlight, the at least one phosphor can include: a red phosphor wavelength-converting the ultraviolet light into red light; a green phosphor wavelength-converting the ultraviolet light into green light; and a blue phosphor wavelength-converting the ultraviolet light into blue light. $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like can be used as the red phosphor. $(Si, Al)_6 (O, N)$: $Eu^{2+}$, $BaMgAl_{10}O_{17}$: $Eu^{2+} Mn^{2+}$, $(Ba, Sr)_2SiO_4$: $Eu^{2+}$ and the like can be used as the green phosphor. $(Sr, Ca, Ba, Mg)_{10} (PO_4)_6C_{12}$: $Eu^{2+}$, $BaMgAl_{10}O_{17}$: $Eu^{2+}$, $LaAl (Si, Al)_6 (N, O)_{10}$: $Ce^{3+}$ and the like can be used as the blue phosphor.

In addition, the wavelength converting layer 14 can be made by mixing a phosphor with a transparent resin, an inorganic binder and the like in order to be able to emit light having a desired color tone while collaborating with the semiconductor light-emitting chip 12. Specifically, the semiconductor light-emitting device can emit light having various color tones by varying a combination of the above-described phosphors, and/or by varying a density ratio of the combination of the phosphors in accordance with a variety of usages.

Moreover, the wavelength converting layer 14 can include a particulate spacer 16 having a particle size (e.g., 40 micro meter), such that is disclosed in Patent Document No. 3, along with the phosphor, which is formed in a particular shape. The particulate spacer 16 can enable the wavelength converting layer 14 to be disposed at a prescribed thickness between the top surface of the semiconductor light-emitting chip 12 and the bottom surface of the transparent plate 15 as shown in FIG. 1. The particulate spacers 16 can include at least one of an oxide silicon particle and a glass bead each having a high thermal resistance and a transparency, and the particle size of the particulate spacer 16 can be 10 to 100 micro meter. The number of the particulate spacer 16 can be three or more.

Furthermore, on the side surface of the wavelength converting layer 14, the side convex surface 140 can be included between the side surface of the transparent plate 15 and the side surface of the semiconductor light-emitting chip 12 so as to project toward the reflective layer 17. FIG. 1 shows an exemplary case where the side convex surface 140 is formed from the side surface of the transparent plate 15 to an edge portion between the side surface and the bottom surface of the semiconductor light-emitting chip 12. However, the side convex surface 140 may also be formed between the side surfaces of the transparent plate and the semiconductor light-emitting chip 12, as described above. The side surface of the reflective layer 17 contacts with the convex surface 140 of the wavelength converting layer 14 and with a part of the side surface of the transparent plate 15 located in an inward direction from an apex of the convex surface 140 of the wavelength converting layer 14.

The transparent plate 15 can be a transparent material, which can transmit light emitted from the semiconductor light-emitting chip 12 via the wavelength converting layer 14. A transparent resin such as a silicone resin, an epoxy resin and the like can be used, and a transparent resin that is made by mixing a filler having a particle size of 0.001 to 50 micro meters with the above-described transparent resin and an inorganic material such as a glass and the like can be used as the transparent plate 15. A ceramic plate (e.g., YAG plate) that is made by sintering a phosphor material can also be used as the transparent plate 15.

The top surface and the bottom surface of the transparent plate 15 are formed in a substantially planar shape as shown in FIG. 1. However, both shapes of the top and the bottom surfaces of the transparent plate 15 should not be limited to the planar shape. At least one of the top and the bottom surfaces of the transparent plate 15 can be formed in a fine concave-convex shape to diffuse the above-described wavelength converted light and to form a prescribed light distribution using the wavelength converted light. A surface treatment can be formed on the top surface of the transparent plate 15 in order to improve a light-emitting efficiency as a light-emitting surface of the device, and the top surface of the transparent plate 15 can also be formed in a lens shape to form a prescribed light distribution.

In the above-described embodiment shown in FIG. 1, a size of the top surface and the bottom surface of the transparent plate 15 may be slightly smaller than the top surface of the semiconductor light-emitting chip 12. However, the size of the transparent plate 15 should not be limited to the above-described size. The size of the transparent plate 15 may be slightly larger than the top surface of the semiconductor light-emitting chip 12, as described later with reference to FIG. 8, and also may be the same as the top surface of the semiconductor light-emitting chip 12, for example, if the side convex surface 140 on the side surface of the wavelength converting layer 14 can be formed between the side surface of the transparent plate 15 and the side surface of the semiconductor light-emitting chip 12.

The reflective layer 17 can include a base material such as a resin including a silicon resin and an inorganic binder, and also can include a filler such as titanium oxide, zinc oxide, tantalum oxide, niobium oxide, zirconia oxide, aluminum oxide, aluminum nitride and the like as a reflective substance in the base material. The reflective layer 17 can be disposed in the cavity of the casing 11 so that the top surface of the transparent plate 15 is exposed as the light-emitting surface of the device from the reflective layer 17.

In the first embodiment shown in FIG. 1, in order to avoid covering the top surface of the transparent plate 15 with the reflective layer 17, the reflective layer 17 is disposed in the cavity of the casing 11 so that the top surface thereof is lower than the top surface of the transparent plate 15. However, the top surface of the reflective layer 17 should not be limited to the above-described position. If the reflective layer 17 does not cover the part of the top surface of the transparent plate 15, the reflective layer 17 can be disposed in the cavity of the casing 11 at the same level as the top surface of the transparent plate 15.

According to the semiconductor light-emitting device having the above-described structure, light emitted in an upward direction from the semiconductor light-emitting chip 12 can enter into the wavelength converting layer 14, and a wavelength converted light can be emitted from the top surface of the transparent plate 15, which is the light-emitting surface of the device. A large portion of the light emitted in a downward direction from the semiconductor light-emitting chip 12 can be reflected by at least one of the bottom surface of the semiconductor light-emitting chip 12, the reflective layer 17 and the top surface of the mounting surface of the casing 11, and then a wavelength converted light can be emitted from the top surface of the transparent plate 15 via the top surface of the wavelength converting layer 14 along with the light emitted in the upward direction from the semiconductor light-emitting chip 12.

Light emitted in a crosswise direction from the semiconductor light-emitting chip 12 such as light emitted from the side surface of the semiconductor light-emitting chip 12 and light directed in a crosswise direction from the wavelength converting layer 14 can be reflected toward the top surface of the transparent plate 15 via the reflective layer 17 while being wavelength-converted by the wavelength converting layer 14, and the wavelength converted light can be emitted from the top surface of the transparent plate 15 to the outside of the device.

FIG. 2 is a side cross-sectional view showing a comparative embodiment, which is made to compare optical characteristics of the first embodiment of FIG. 1. The comparative embodiment includes: the casing 11, and the semiconductor light-emitting chip 12 having a blue-lighting wavelength and the chip electrodes adjacent the bottom surface mounted on the mounting surface of the casing 11 via the solder bumps 13 so as to emit blue light toward the optical axis thereof, each of the chip electrodes electrically connected to the respective conductor patterns of the casing 11 via the solder bumps 13, and the top surface thereof formed in a square shape having a side of 0.80 millimeter, in common with the first embodiment; and a transparent plate 15 made of a borosilicate glass having a thickness between 0.1 and 0.3 millimeter and a square surface having a side of 0.86 millimeter as a top and bottom surface thereof, being located over the top surface of the semiconductor light-emitting chip 12 so as to cover the top surface of the semiconductor light-emitting chip 12, and therefore the top surface and bottom surface thereof being slightly larger than the top surface of the semiconductor light-emitting chip 12 and thereof being slightly larger than that of the first embodiment.

In addition, the comparative embodiment includes: the wavelength converting layer 14 having a side concave surface 140a made by mixing a silicone resin having a standard viscosity between 3.5 and 5.0 Pa·s with YAG phosphor at 50 weight percent, disposed between edge portions of the bottom surfaces of the semiconductor light-emitting chip 12 and the transparent plate 15, in which a space between the top surfaces of the semiconductor light-emitting chip 12 and the transparent plate 15 is 0.040 millimeter, so as to extend in an inner direction of the semiconductor light-emitting chip 12 between the edge portions of the bottom surfaces of the semiconductor light-emitting chip 12 and the transparent plate 15, and therefore the side concave surface 140a thereof being formed in a different shape from the side convex surface 140 of the first embodiment; and the reflective layer 17 disposed between the cavity of the casing 11 so as to fill the space between the solder bumps 13, in common with the first embodiment. In this case, the comparative embodiment increases the amount of the YAG phosphor at the 50 weight percent so as to be able to easily form the side concave surface 140a, as compared with a mixing ratio of the phosphor contained in the wavelength converting layer 14 of the first embodiment.

FIG. 3 is a graph showing a relation between a directional angle and a difference of color temperature with respect to a color temperature at directional angle zero in each of the first embodiment and the comparative embodiment. The X-axis of FIG. 3 shows the directional angle, in which zero degree of the directional angle is each of optical axes, which are perpendicular to light-emitting surfaces of devices. The Y-axis shows a difference of color temperature with respect to a color temperature at directional angle zero. The larger the directional angle on X-axis is, the closer the directional angle is from each of the optical axes toward each of the light-emitting surface of the devices.

Accordingly, when the directional angle is zero degree, that is to say, when color temperatures of the first embodiment and the comparative embodiment are measured from each of the optical axes of the devices, each of differences of the color temperatures with respect to a color temperature at directional angle zero become zero. When the directional angle is 30 degrees, a difference of the color temperature of the comparative embodiment shows approximately 1,200 and that of the first embodiment shows approximately 600. Therefore, when the directional angle is 30 degrees, the difference of the color temperature of the first embodiment can become half of that of the comparative embodiment.

Even when the directional angle is 80 to 85 degrees, which is located in a direction close to the light-emitting surface, the difference of the color temperature of the first embodiment becomes approximately half of that of the comparative embodiment. That may be because a part of light having a long path length, which emits toward a large direction angle in the comparative embodiment, may emit toward a small direction angle by using the side concave surface 140 of the reflective layer 17 in the first embodiment. Therefore, the disclosed subject matter can increase a difference of the color temperature based upon the directional angle as compared with the comparative embodiment and the conventional embodiments.

FIG. 4a is a perspective structural view showing a second exemplary embodiment, which combines the semiconductor light-emitting device of FIG. 1 with a projector lens. When the projector lens 130 having an optical axis OX and at least one focus located on the optical axis OX is located close to the semiconductor light-emitting device 30 so that the optical axis thereof substantially correspond to (i.e., are collinear with or almost collinear with) the optical axis of the semiconductor light-emitting device 30 and so that the at least one focus thereof is located near the semiconductor light-emitting device 30, the wavelength converted light emitted from the semiconductor light-emitting device 30 can be projected via the projector lens 130 as a prescribed light distribution pattern having a substantially uniform color tone, which reduces the color variability as compared with the conventional embodiments.

FIG. 4b is an explanatory drawing depicting a light distribution pattern when replacing the semiconductor light-emitting device 30 with the comparative embodiment. Although the light distribution pattern is projected on a relative near screen, a central zone A of the light distribution pattern becomes a relatively high color temperature, and therefore a relatively bluish white light is projected on the central zone A. By contrast, an outer zone B formed in a ring shape of the light distribution pattern becomes a relatively low color temperature, and therefore a relative yellowish white light is projected on the outer zone B as compared with the central zone A.

FIG. 5 is a cross-sectional views showing path directions of light components in a crosswise direction of the semiconductor light-emitting chip 12 emitted from the chip 12 in the semiconductor light-emitting device. In the semiconductor light-emitting device of the disclosed subject matter, the yellow light excited by blue light of the light components emitted in the crosswise direction of the semiconductor light-emitting chip 12 can be reflected on the side concave surface 140 of the reflective layer 17, and then can be directed toward a central region of the light-emitting surface of the transparent plate 15, as shown by arrows D in FIG. 5, in contrast to arrows C shown in the comparative embodiment of FIG. 2.

The yellow light directed toward the central region can be mixed with light having a strong blue wavelength emitted along the optical axis of the semiconductor light-emitting chip 12 in light emitted from the chip 12, and therefore a color temperature on the central region of the light-emitting surface can increase and a color temperature on the outer region formed in a ring shape can be reduced. As a result, the disclosed subject matter can provide a semiconductor light-emitting device having a substantially uniform color tone, in which a color variability of light emitted from the light-emitting surface reduces due to a small difference of the color temperature between the central region and the outer region.

It has been well known that a lighting technology for beautifully showing goods laid out in a show window is difficult. One of the reasons is because it may be difficult for a lighting unit to illuminate the goods in a wide show window with light having a uniform color tone and with a small structure such that customers do not notice the illumination light. However, according to the semiconductor light-emitting device of the second embodiment as shown in FIG. 4a, the semiconductor light-emitting device can emit various wavelength converted lights having a substantially uniform color tone with a wide range for the show window and with a simple structure by using the projector lens 130.

In addition, the second embodiment can be used as a basic structure for a direct projector typed headlight without a reflector. Specifically, light emitted from the semiconductor light-emitting device 30 can be projected in reverse with respect to a vertical line via the projector lens 130. Accordingly, by forming one side of the light-emitting surface of the semiconductor light-emitting device 30 in a line including an elbow line such as a horizontal cut-off line for a low beam, the light emitted from the semiconductor light-emitting device 30 can form a light distribution pattern having a substantially uniform white color tone for a low beam via the projector lens 130 as well as a light distribution pattern for a high beam.

Furthermore, the disclosed subject matter can provide semiconductor light-emitting devices that can emit a wavelength converted light having a substantially uniform white color tone and a high light-emitting efficiency from a small light-emitting surface. Thus, the semiconductor light-emitting device of the disclosed subject matter can also be used as a light source for a projector headlight including a plurality of optical units each having a light distribution pattern for a low beam, which is disclosed in Patent Document No. 4.

An exemplary manufacturing method for the above-described semiconductor light-emitting device will now be described in detail with reference to FIGS. 6a to 6d. FIGS. 6a to 6d are cross-sectional views showing an exemplary manufacturing process for a semiconductor light-emitting device made in accordance with principles of the disclosed subject matter.

Process (a) is preparing the casing 11 having the mounting surface and the conductor patterns formed on the mounting surface thereof including the base board 11a and the frame 11b and the semiconductor light-emitting chip 12, mounting the semiconductor light-emitting chip 12 on the conductor patterns of the base board 11a via the solder bumps 13, as shown in FIG. 6a.

Process (b) is preparing the transparent plate 15 and an uncured wavelength converting material 14b mixing a base material with a phosphor at a prescribed density, disposing the uncured wavelength converting material 14b on the top surface of the semiconductor light-emitting chip 12 so as to become a predetermined thickness by a printing method, a potting method, etc. and mounting the transparent plate 15 on the uncured wavelength converting material 14b.

In this case, the transparent plate 15 may be mounted by its own weight or by applying a load, in a direction of an arrow E as shown in FIG. 6b. In addition, in order for the uncured wavelength converting material 14b to form a predetermined uniform thickness between the top surface of the semiconductor light-emitting chip 12 and the bottom surface of the transparent plate 15, the uncured wavelength converting material 14b can include spacers, examples of which are disclosed in Patent Document No. 3.

In addition, the uncured wavelength converting material 14b may include the side convex surface 14c between the side surface of the transparent plate 15 and the side surface of the semiconductor light-emitting chip 12 due to a surface tension thereof while the uncured wavelength converting material 14b covers at least a part of the side surface of the semiconductor light-emitting chip 12 by using a part of the uncured wavelength converting material 14, which is spilled (or caused to flow) between the transparent plate 15 and the semiconductor light-emitting chip 12.

Process (c) is forming the wavelength converting layer 14 described above by solidifying the uncured wavelength converting material 14b under a predetermined curing condition, as shown in FIG. 6c. In this case, if a shape of the uncured wavelength converting material 14b does not vary, before completely solidifying the uncured wavelength converting material 14b, the following process may be carried out in a semi-solidifying state of the uncured wavelength converting material 14b to reduce the manufacturing lead time.

Process (d) is preparing an uncured reflective material 170 by mixing the base material with the filler having the reflective substance, disposing the uncured reflective material 170 in the cavity of the casing 11 by a potting method or the like so that an inner end of a top surface of the uncured reflective material 170 contacts with a slightly lower position on the side surface of the transparent plate 15 than an edge portion between the top surface and the side surface of the transparent plate 15 and so that a side concave surface 140 is formed on the side surface of the uncured reflective material 170. The method includes forming the reflective layer 17 including the side concave surface 140 by solidifying the uncured reflective material 170 under a predetermined condition, and finishing the semiconductor light-emitting device, as shown in FIG. 6d. The above process steps can be done consecutively and sequentially, or can be interchanged in timing and non-sequential and/or simultaneous.

Figure 7A:
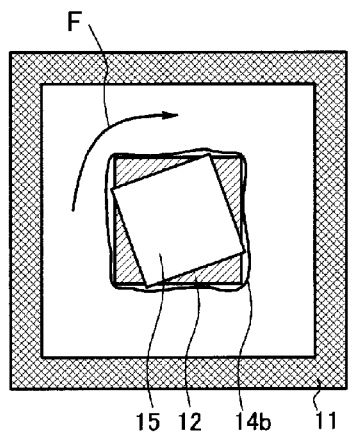
FIGS. 7a and 7b are top views showing a beginning and an ending of a self-aligning behavior with respect to a transparent plate mounted on the uncured wavelength converting material in mounting process (b) of the transparent plate in the manufacturing process of FIGS. 6a to 6d, respectively.
Figure 7B:
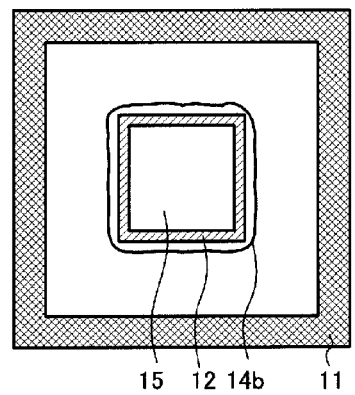

FIGS. 7a and 7b are top views showing a beginning and an ending of a self-aligning behavior with respect to the transparent plate 15 mounted on the uncured wavelength converting material 14b in mounting process (b) of the transparent plate 15 in the above-described manufacturing process, respectively. In this process, as long as the transparent plate 15 is placed on the uncured wavelength converting layer 14b even if the transparent plate 15 is placed at a position such that the orientation of the plate 15 does not match the orientation of the top surface of the semiconductor light-emitting chip 12 as shown in FIG. 7a, because the self-aligning behavior operates in a direction of arrow F shown in FIG. 7a, the transparent plate 15 can be mounted on the uncured wavelength converting material 14b so as to match the orientation of the top surface of the semiconductor light-emitting chip 12, as shown in FIG. 7b.

One of the reasons why the self-aligning behavior operates in a direction of arrow F may be because the self-aligning behavior may operate so that the orientation of the transparent plate 15 matches the orientation of the top surface of the semiconductor light-emitting chip 12 by a surface tension of the uncured wavelength converting material adhering to the side surface of the transparent plate 15. In addition, when the uncured wavelength converting material 14b includes the spacer 16, the spacer 16 may prevent the transparent plate 15 from sinking into the uncured wavelength converting material 14b, and therefore the transparent plate 15 may become easy to move in the direction of arrow F, which is a horizontal direction.

Moreover, even when a plurality of light-emitting chips is used as the semiconductor light-emitting chip 12, because the transparent plate 15 is one piece, the transparent plate 15 can be mounted on the uncured wavelength converting material 14b so that the transparent plate 15 orientation matches the orientation of the top surface structured by the plurality of light-emitting chips by the above-described self-aligning behavior.

FIG. 8 is a side cross-sectional view showing a third exemplary embodiment of a semiconductor light-emitting device made in accordance with principles of the disclosed subject matter. The third embodiment can include a plurality of semiconductor light-emitting chips 12, and the transparent plate 15, which is slightly larger than the top surface of the semiconductor light-emitting chips 12. Other structures can be substantially the same as in the first embodiment of FIG. 1. In this case, the semiconductor light-emitting device can emit stronger wavelength converting light having a substantially uniform color tone and a high light-emitting efficiency by using the semiconductor light-emitting chips 12 as compared to the device of the first embodiment, as show in FIG. 1.

However, because the bottom surface of the transparent plate 15 is slightly larger than the top surface of the semiconductor light-emitting chips 12, the uncured wavelength converting material 14b may be difficult to adhere on the side surface of the transparent plate 15, and therefore the above-described self-aligning behavior may also be difficult to operate with respect to the transparent plate 15 in the mounting process (b) of the transparent plate 15. Accordingly, the uncured wavelength converting material 14b can become easy to adhere on the side surface of the transparent plate 15 by forming the edge portion between the side surface and the bottom surface of the transparent plate 15 in a taper shape and/or a round shape, as shown in FIG. 8.

Thereby, the transparent plate 15 can be mounted on the uncured wavelength converting material so as to orient itself with respect to the top surface of the semiconductor light-emitting chips 12. Additionally, the uncured wavelength converting material 14b can be disposed between the top surface of the semiconductor light-emitting surfaces 12 and the bottom surface of the transparent plate 15 while the semiconductor light-emitting chips 12 mounted in the casing 11 are directed downward. In this case, the uncured wavelength converting material 14b can also be disposed between the top surface of the semiconductor light-emitting chips 12 and the bottom surface of the transparent plate 15 by applying the uncured wavelength converting material 14b underneath the top surface of the semiconductor light-emitting chips 12.

Moreover, the uncured wavelength converting material 14b can be disposed between the top surface of the semiconductor light-emitting chips 12 and the bottom surface of the transparent plate 15 by applying the uncured wavelength converting material 14b on the bottom surface of the transparent plate 15. The uncured wavelength converting material 14b can also be disposed between the top surface of the semiconductor light-emitting chips 12 and the bottom surface of the transparent plate 15 by applying the uncured wavelength converting material 14b both underneath the top surface of the semiconductor light-emitting chip 12 and on the bottom surface of the transparent plate 15.

As described above, the disclosed subject matter can form a light-emitting surface in a very small shape such that the light emitting surface is smaller than the top surface of the semiconductor light-emitting chip 12, and can improve a light-colored variability and a light-emitting efficiency by using the side surface of the reflective layer 17 and the boundary between the bottom surface of the semiconductor light-emitting chip 12 and the reflective layer 17 as a reflector for the semiconductor light-emitting chip 12. Thus, the disclosed subject matter can provide semiconductor light-emitting devices that can emit a wavelength converting light having a substantially uniform color tone and a high light-emitting efficiency from a small light-emitting surface, which can be used for lighting units such as a vehicle headlight that controls light emitted from the light-emitting device using a reflector and/or a projector lens, and which can be used for lighting units such as an illumination for a show window of the wide illuminating range with a small/simple structure.

Moreover, the side concave surface 140 of the reflective layer 17 can be formed by disposing the uncured reflective material 170 in the cavity of the casing 11 after forming the convex surface 140 of the wavelength converting layer 14 by disposing the uncured wavelength converting material 14b between the semiconductor light-emitting chip 12 and the transparent plate 15 without a mechanical process. Thus, the method of the disclosed subject matter can provide a semiconductor light-emitting device capable of being used as a lighting unit such as a headlight using manufacturing machines that are similar to those used to manufacture conventional semiconductor light-emitting devices.

Furthermore, the above-described embodiments are mainly described as a light source device for a vehicle headlight and an illumination of a show window. However, the semiconductor light-emitting device can incorporate various colored lights by combining the above-described semiconductor chip 12 with the wavelength converting layer 14 including at least one phosphor, and therefore can also be used as a light source device for various applications such as general lighting, a street light, stage lighting, traffic lights and the like using a small and simple optical member. In addition, it is conceived that each of the different aspects and features of the different embodiments disclosed herein could be used interchangeably in and with the other disclosed embodiments. For example, the multiple chips embodiment can include at least the side surface including the concave surface of the reflective layer 17 as the reflector. In addition, one side of a device can include the concave surface 140 while another side of the device includes substantially no concave surface (e.g., plane surface). In addition, it is contemplated that any different color chip or different wavelength converting material can be used in any of the disclosed embodiments and in any combination.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art and patent document references described above are hereby incorporated in their entirety by reference.

What is claimed is:

1. A semiconductor light-emitting device including an optical axis comprising:
   a base board having a mounting surface and a conductor pattern formed on the mounting surface, and the mounting surface including an outer circumference;
   a frame formed in a tubular shape and being located on the outer circumference of the mounting surface of the base board;

at least one semiconductor light-emitting chip having a bottom surface, a side surface and a top surface including a center, and including chip electrodes adjacent the bottom surface, each of the chip electrodes electrically connected to a respective portion of the conductor pattern of the base board via solder bumps;

a transparent plate having a top surface, a side surface and a bottom surface, and being located over the top surface of the at least one semiconductor light-emitting chip, each of the top surface and the bottom surface of the transparent plate being smaller than the top surface of the semiconductor light-emitting chip, and the top surface of the transparent plate being configured to become a light-emitting surface of the light-emitting device;

a wavelength converting layer having a side surface and including at least one phosphor, the wavelength converting layer disposed between the side surface of the transparent plate and the side surface of the at least one semiconductor light-emitting chip so that the side surface of the wavelength converting layer includes a convex surface, which extends toward the frame at a location between the side surface of the at least one semiconductor light-emitting chip and the side surface of the transparent plate, and a part of the convex surface being laterally covering the side surface of the at least one semiconductor light-emitting chip and another part of the convex surface laterally covering the side surface of the transparent plate; and a reflective layer having a side surface, the side surface of the reflective layer including a concave surface in contact with the convex surface of the side surface of the wavelength converting layer, the reflective layer disposed between the frame and both the side surface of the wavelength converting layer and the side surface of the transparent plate and between the bottom surface of the at least one semiconductor light-emitting chip and the mounting surface of the base board while surrounding the solder bumps, wherein the side surface of the reflective layer contacts with the convex surface of the wavelength converting layer and a part of the side surface of the transparent plate that is located in an inward direction from an apex of the convex surface of the wavelength converting layer, and wherein the optical axis of the semiconductor light-emitting device extends substantially normal with respect to the top surface of the at least one semiconductor light-emitting chip from substantially the center of the top surface of the at least one semiconductor light-emitting chip.

2. The semiconductor light-emitting device according to claim 1, wherein the frame is integrated into the base board as one casing.

3. The semiconductor light-emitting device according to claim 1, wherein the wavelength converting layer includes a spacer, which maintains a substantially uniform thickness of the wavelength converting layer disposed between the bottom surface of the transparent plate and the top surface of the semiconductor light-emitting chip.

4. The semiconductor light-emitting device according to claim 2, wherein the wavelength converting layer includes a spacer, which maintains a substantially uniform thickness of the wavelength converting layer disposed between the bottom surface of the transparent plate and the top surface of the semiconductor light-emitting chip.

5. The semiconductor light-emitting device according to claim 1, wherein the at least one semiconductor light-emitting chip includes a blue light-emitting chip and the at least one phosphor of the wavelength converting layer is selected from the group consisting of a yellow phosphor, and two phosphors including a red phosphor layer and a green phosphor layer.

6. The semiconductor light-emitting device according to claim 2, wherein the at least one semiconductor light-emitting chip includes a blue light-emitting chip and the at least one phosphor of the wavelength converting layer is selected from the group consisting of a yellow phosphor, and two phosphors including a red phosphor layer and a green phosphor layer.

7. The semiconductor light-emitting device according to claim 1, further comprising:
a projector lens having an optical axis and at least one focus located on the optical axis being located in a light-emitting direction of the semiconductor light-emitting device so that the optical axis of the projector lens substantially corresponds to the optical axis of the semiconductor light-emitting device and the focus of the projector lens is located substantially at the semiconductor light-emitting device.

8. The semiconductor light-emitting device according to claim 2, further comprising:
a projector lens having an optical axis and at least one focus located on the optical axis being located in a light-emitting direction of the semiconductor light-emitting device so that the optical axis of the projector lens substantially corresponds to the optical axis of the semiconductor light-emitting device and the focus of the projector lens is located substantially at the semiconductor light-emitting device.

9. The semiconductor light-emitting device according to claim 3, further comprising:
a projector lens having an optical axis and at least one focus located on the optical axis being located in a light-emitting direction of the semiconductor light-emitting device so that the optical axis of the projector lens substantially corresponds to the optical axis of the semiconductor light-emitting device and the focus of the projector lens is located substantially at the semiconductor light-emitting device.

10. The semiconductor light-emitting device according to claim 4, further comprising:
a projector lens having an optical axis and at least one focus located on the optical axis being located in a light-emitting direction of the semiconductor light-emitting device so that the optical axis of the projector lens substantially corresponds to the optical axis of the semiconductor light-emitting device and the focus of the projector lens is located substantially at the semiconductor light-emitting device.

11. A semiconductor light-emitting device comprising:
a base board having a mounting surface and a conductor pattern formed on the mounting surface, and the mounting surface including an outer circumference;
a frame formed in a tubular shape and being located on the outer circumference of the mounting surface of the base board;
at least one semiconductor light-emitting chip having a top surface, a side surface and a bottom surface, and including chip electrodes adjacent the bottom surface, each of the chip electrodes electrically connected to a respective portion of the conductor pattern of the base board via solder bumps;
a transparent plate having a top surface, a side surface and a bottom surface, and being located over the top surface of the at least one semiconductor light-emitting chip, each of the top surface and the bottom surface of the transparent plate being larger than the top surface of the semiconductor light-emitting chip, and the top surface of the transparent plate being configured to become a light-emitting surface of the light-emitting device;

a wavelength converting layer having a side surface and including at least one phosphor, the wavelength converting layer disposed between the side surface of the transparent plate and the side surface of the at least one semiconductor light-emitting chip so that the side surface of the wavelength converting layer includes a convex surface, which extends toward the frame at a position between the side surface of the at least one semiconductor light-emitting chip and the side surface of the transparent plate, and a part of the convex surface being laterally covering the side surface of the at least one semiconductor light-emitting chip and another part of the convex surface laterally covering the side surface of the transparent plate; and a reflective layer having a side surface, the side surface of the reflective layer including a concave surface in contact with the convex surface of the side surface of the wavelength converting layer, the reflective layer disposed between the frame and both the side surface of the wavelength converting layer and the side surface of the transparent plate and between the bottom surface of the at least one semiconductor light-emitting chip and the mounting surface of the base board while surrounding the solder bumps, wherein the side surface of the reflective layer contacts with the convex surface of the wavelength converting layer and a part of the side surface of the transparent plate that is located in an inward direction from an apex of the convex surface of the side surface of the wavelength converting layer.

12. The semiconductor light-emitting device according to claim 11, wherein the frame is integrated into the base board as one casing.

13. The semiconductor light-emitting device according to claim 11, wherein the wavelength converting layer includes a spacer, which maintains a substantially uniform thickness of the wavelength converting layer disposed between the bottom surface of the transparent plate and the top surface of the semiconductor light-emitting chip.

14. The semiconductor light-emitting device according to claim 12, wherein the wavelength converting layer includes a spacer, which maintains a substantially uniform thickness of the wavelength converting layer disposed between the bottom surface of the transparent plate and the top surface of the semiconductor light-emitting chip.

15. A method for manufacturing the semiconductor light-emitting device according to claim 1, comprising:
providing a casing integrally comprising the base board and the frame;
connecting each of the chip electrodes of the at least one semiconductor light-emitting chip to a respective portion of the conductor pattern of the base board of the casing via the solder bumps;
disposing an uncured wavelength converting material between the bottom surface of the transparent plate and the top surface of the at least one semiconductor light-emitting chip so as to flow between the transparent plate and the at least one semiconductor light-emitting chip, and therefore the uncured wavelength converting material forming the side convex surface between the side surface of the transparent plate and the side surface of the semiconductor light-emitting chip; and
disposing an uncured reflective material between the frame and both the side surface of the wavelength converting layer and the side surface of the transparent plate and between the bottom surface of the at least one semiconductor light-emitting chip and the mounting surface of the base board.

16. A method for manufacturing the semiconductor light-emitting device according to claim 2, comprising:
providing the base board;
connecting each of the chip electrodes of the at least one semiconductor light-emitting chip to a respective portion of the conductor pattern of the base board of the casing via the solder bumps;
disposing an uncured wavelength converting material between the bottom surface of the transparent plate and the top surface of the at least one semiconductor light-emitting chip so as to flow between the transparent plate and the at least one semiconductor light-emitting chip, and therefore the uncured wavelength converting material forming the side convex surface between the side surface of the transparent plate and the side surface of the semiconductor light-emitting chip; and
disposing an uncured reflective material between the frame and both the side surface of the wavelength converting layer and the side surface of the transparent plate and between the bottom surface of the at least one semiconductor light-emitting chip and the mounting surface of the base board.

17. A method for manufacturing the semiconductor light-emitting device according to claim 11, comprising:
providing a casing integrally comprising the base board and the frame;
connecting each of the chip electrodes of the at least one semiconductor light-emitting chip to a respective portion of the conductor pattern of the base board via the solder bumps;
disposing an uncured wavelength converting material between the bottom surface of the transparent plate and the top surface of the at least one semiconductor light-emitting chip so as to flow between the transparent plate and the at least one semiconductor light-emitting chip, and therefore the uncured wavelength converting material forming the side convex surface between the side surface of the transparent plate and the side surface of the semiconductor light-emitting chip; and
disposing an uncured reflective material between the frame and both the side surface of the wavelength converting layer and the side surface of the transparent plate and between the bottom surface of the at least one semiconductor light-emitting chip and the mounting surface of the base board.

18. A method for manufacturing the semiconductor light-emitting device according to claim 12, comprising:
providing the base board;
connecting each of the chip electrodes of the at least one semiconductor light-emitting chip to a respective portion of the conductor pattern of the base board via the solder bumps;
disposing an uncured wavelength converting material between the bottom surface of the transparent plate and the top surface of the at least one semiconductor light-emitting chip so as to flow between the transparent plate and the at least one semiconductor light-emitting chip, and therefore the uncured wavelength converting material forming the side convex surface between the side surface of the transparent plate and the side surface of the semiconductor light-emitting chip; and
disposing an uncured reflective material between the frame and both the side surface of the wavelength converting layer and the side surface of the transparent plate and between the bottom surface of the at least one semiconductor light-emitting chip and the mounting surface of the base board.

19. The semiconductor light-emitting device according to claim 1, wherein the semiconductor light-emitting chip is an ultraviolet light-emitting chip and the at least one phosphor of the wavelength converting layer includes at least one of a red phosphor, a green phosphor, and a blue phosphor.

20. The semiconductor light-emitting device according to claim 2, wherein the semiconductor light-emitting chip is an ultraviolet light-emitting chip and the at least one phosphor of the wavelength converting layer includes at least one of a red phosphor, a green phosphor, and a blue phosphor.

* * * * *